United States Patent
Lipp (10) Patent No.: US 8,385,449 B2
(45) Date of Patent: Feb. 26, 2013

(54) METHOD AND DEVICE FOR DETECTING SIMULTANEOUS DOUBLE TRANSMISSION OF AM SIGNALS

(75) Inventor: Friedrich Lipp, Munich (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 392 days.

(21) Appl. No.: 12/513,485

(22) PCT Filed: Apr. 21, 2008

(86) PCT No.: PCT/EP2008/003201
§ 371 (c)(1),
(2), (4) Date: Jul. 16, 2009

(87) PCT Pub. No.: WO2008/138453
PCT Pub. Date: Nov. 20, 2008

(65) Prior Publication Data
US 2010/0067570 A1    Mar. 18, 2010

(30) Foreign Application Priority Data

May 9, 2007  (DE) .......................... 10 2007 021 768
Aug. 7, 2007 (DE) .......................... 10 2007 037 105

(51) Int. Cl.
*H04L 5/12* (2006.01)
*H03K 9/00* (2006.01)
*G06F 17/14* (2006.01)

(52) U.S. Cl. .................... 375/265; 375/316; 708/400
(58) Field of Classification Search .................. 375/265, 375/316; 708/400
See application file for complete search history.

(56) References Cited

U.S. PATENT DOCUMENTS

| | | | |
|---|---|---|---|
| 3,728,634 A | | 4/1973 | Watkinson |
| 5,392,231 A | * | 2/1995 | Takahashi ..................... 708/400 |
| 5,475,629 A | * | 12/1995 | Takahashi ..................... 708/400 |
| 5,475,709 A | | 12/1995 | Futagami et al. |
| 5,630,012 A | * | 5/1997 | Nishiguchi et al. ........... 704/208 |
| 5,940,748 A | | 8/1999 | Daughtry, Jr. et al. |
| 5,959,965 A | | 9/1999 | Ohkubo et al. |
| 6,823,025 B2 | | 11/2004 | Lee et al. |
| 6,977,978 B1 | | 12/2005 | Jakobsson |
| 7,376,170 B2 | | 5/2008 | Scheck |
| 7,428,270 B1 | * | 9/2008 | Dubuc et al. .................. 375/316 |

(Continued)

FOREIGN PATENT DOCUMENTS

| | | |
|---|---|---|
| CN | 1639962 A | 7/2005 |
| EP | 0 378 719 | 7/1990 |
| WO | WO-2004/015853 | 2/2004 |

OTHER PUBLICATIONS

International Search Report for PCT/EP2008/003201 dated Dec. 9, 2008.

*Primary Examiner* — David C. Payne
*Assistant Examiner* — Sarah Hassan
(74) *Attorney, Agent, or Firm* — Marshall, Gerstein & Borun LLP (57) ABSTRACT

A device that detects the presence of several amplitude-modulated high-frequency signals in a sum signal with closely-adjacent carrier frequencies. The sum signal is phase-demodulated by a phase demodulator and Fourier-transformed by a Fourier-transformation device. On the basis of the Fourier transform, the presence of several carrier frequencies is determined by an evaluation device.

17 Claims, 8 Drawing Sheets

U.S. PATENT DOCUMENTS

| | | | |
|---|---|---|---|
| 7,466,645 B2 * | 12/2008 | Mori et al. | 370/208 |
| 2002/0012405 A1 | 1/2002 | Lee et al. | |
| 2003/0112261 A1 * | 6/2003 | Zhang | 345/716 |
| 2003/0144839 A1 * | 7/2003 | Dharanipragada et al. | 704/246 |
| 2004/0246998 A1 * | 12/2004 | Ma et al. | 370/527 |
| 2005/0114097 A1 * | 5/2005 | Duncan | 703/1 |
| 2005/0288599 A1 * | 12/2005 | MacAdam et al. | 600/509 |
| 2007/0092018 A1 * | 4/2007 | Fonseka et al. | 375/265 |

* cited by examiner

METHOD AND DEVICE FOR DETECTING SIMULTANEOUS DOUBLE TRANSMISSION OF AM SIGNALS

BACKGROUND OF THE INVENTION

1. Field of the Invention

The invention relates to a method and a device for detecting simultaneous multiple transmission in communications systems with amplitude-modulated signals, in particular, aeronautical radio equipment in air-traffic control (ATC).

2. Related Technology

With regard to the prior art, reference is made to U.S. Pat. No. 6,823,025 B2, from which a detector for amplitude modulation is known. However, the detection of a double transmission is not possible in this context.

The constantly growing volume of traffic in civil aviation increases the danger of simultaneous double transmissions on the same channel. Especially in busy airports, it can happen that two pilots establish contact with the air-traffic controller simultaneously, without the air-traffic controller or the pilots noticing this hazardous situation. The air-traffic controller hears only the stronger signal and acknowledges the radio communication. By contrast, the unheard pilot thinks that the response from the air-traffic controller applies to him.

The frequently used AM-DSB modulation method (amplitude modulation—two side bands) behaves in a linear manner with regard to multiple reception, so that the weaker received signal (referred to below as the secondary signal) is demodulated in a proportionally quieter manner. Because of the limited signal to noise ratio and background noises in the cockpit, a signal relatively weaker by 20 to 30 dB can hardly be detected.

So long as the quartz precision of the aeronautical radio equipment actually exhausts the range from +/−5 ppm originally specified by the ICAO (International Civil Aviation Organization), a readily-audible whistling tone with the differential frequency of the two aeronautical radio devices occurs. Contemporary aeronautical radio equipment with modern reference oscillators provide very good frequency accuracy with deviations of less than 1 ppm, so that the differential frequency is generally disposed below 100 Hz and is filtered out in the audio filter of the stationary receiver equipment. The simultaneous transmission of two or more signals on the same channel is not generally detected in aeronautical radio equipment.

SUMMARY OF THE INVENTION

The invention provides a method and a device, with which the double or multiple transmission of amplitude-modulated signals of closely-adjacent carrier frequency can be reliably detected in a short time, with low complexity and therefore with low costs.

Accordingly, the invention provides a method for detecting the presence of several amplitude-modulated high-frequency signals in a sum signal with closely-adjacent carrier frequencies of the amplitude-modulated high-frequency signals, comprising:

phase demodulating the sum signal, transforming the phase-demodulated sum signal into the frequency domain, and determining the presence of several carrier frequencies of amplitude-modulated high-frequency signals.

Further, the invention provides a device for detecting the presence of several amplitude-modulated high-frequency signals in the sum signal with closely-adjacent carrier frequencies of the amplitude-modulated high-frequency signals, with a phase demodulator, a transformation device and an evaluation device, wherein the phase of demodulator demodulates the sum signal according to its phase, the transformation device transforms the phase-demodulated sum signal into the frequency domain, and the evaluation device determines the presence of several carrier frequencies of amplitude-modulated high-frequency signals.

In order to detect the presence of several amplitude-modulated high-frequency signals in a sum signal with closely-adjacent carrier frequencies, the sum signal is phase demodulated by a phase demodulator and transformed by a transformation device into the frequency domain, for example, by Fourier transform or wavelet transformation. On the basis of the transformation, the presence of several carrier frequencies is determined by an evaluation device. The presence of several signals can be determined directly from the presence of several carrier frequencies.

The sum signal is advantageously a received signal mixed to an intermediate frequency. Through mixing down, a reduction of the requirements for processing equipment is achieved in view of the reduced frequency of the sum signal.

By preference, the presence of two amplitude-modulated high-frequency signals is detected in the sum signal. The security of detection is significantly improved by the restriction to two signals.

In determining the presence of several carrier frequencies in the sum signal, the carrier frequency offset is advantageously determined. Through the determination of the carrier-frequency offset, an additional dimension of confidence of the detected signals can be determined in view of the various probabilities of the different offset frequencies.

The Fourier transform is preferably implemented simultaneously with several different transformation-window lengths. Accordingly, an optimum detection can be achieved for different carrier-frequency offsets.

The presence of several carrier frequencies in the sum signal is advantageously detected through OR disjunction of the results of the simultaneous Fourier transforms of different transformation-window lengths. Accordingly, a good reliability of detection is achieved.

By preference, several Fourier transforms of the same transformation-window length of signal portions disposed in time succession are implemented and accordingly, the security of the result of the Fourier transform is improved by correlating the results of the several Fourier transforms of identical transformation-window length. In the case of transformation-window lengths, which are disposed below the permitted processing time, the combination in series of several Fourier transforms of identical window length increases the security of the detection.

The presence of several carrier frequencies in the sum signal is advantageously displayed by charging the sum signal with a pilot tone through a pilot-tone generator. The pilot tone is disposed within the audible range, and can therefore be readily perceived by the operating personnel. Alternatively, a visual display is conceivable. In this manner a detection is reliably displayed.

BRIEF DESCRIPTION OF THE DRAWINGS

The invention is described below by way of example with reference to the drawings, in which an advantageous exemplary embodiment of the invention is presented. The drawings are as follows.

DETAILED DESCRIPTION

The signal, upon which the invention is based, will initially be explained with reference to its origin and composition on the basis of FIGS. 1-10. An explanation of the functioning of an exemplary embodiment of the method according to the invention and of the structure of an exemplary embodiment of the device according to the invention will then be provided with reference to FIGS. 11-13. In some cases, the presentation and description of identical elements in similar drawings has not been repeated.

Figure 1:
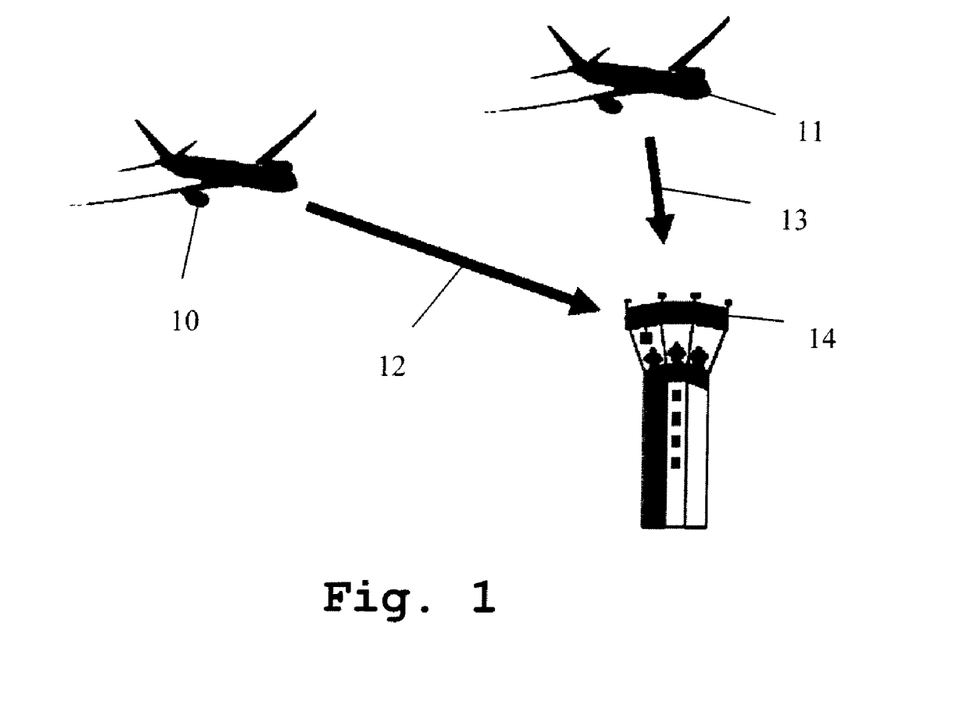
FIG. 1 shows the reception of several signals by an exemplary receiver device.

FIG. 1 shows the reception of several signals by an exemplary receiver device 14. The aircraft 11 transmits a signal from a short distance 13 to the ground station 14. The aircraft 10 transmits the signal 12 to the ground station from a relatively-longer distance. With an identical output power of the signals 12 and 13, there is a significant difference in the power of the signals 12 and 13 received by the ground station.

Figure 2:
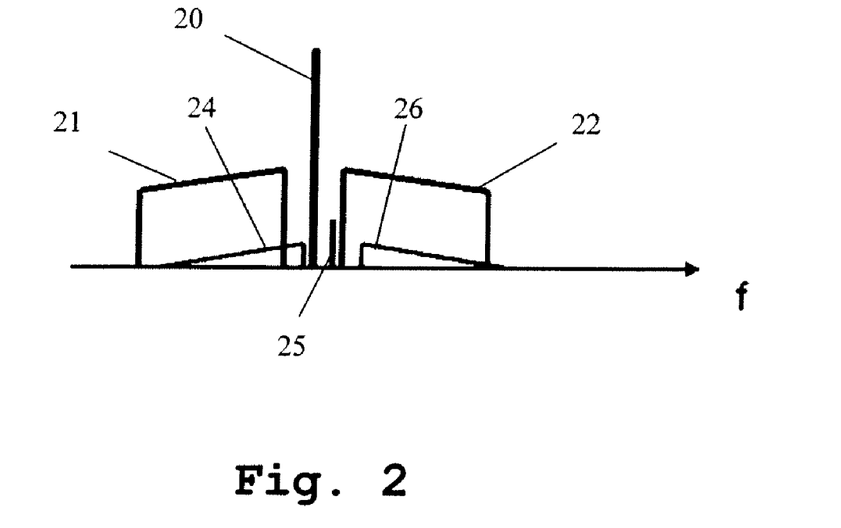
FIG. 2 shows an exemplary spectrum with two amplitude-modulated signals in each case with one carrier signal.

In FIG. 2, an exemplary spectrum with two amplitude-modulated signals in each case with one carrier signal 20 and 25 is presented. The relatively-stronger signal 13 provides a higher amplitude in the spectrum than the relatively-weaker signal 12. Accordingly, the carrier 20 and the side bands 21 and 22 provide a significantly-higher amplitude than the carrier 25 and the side bands 24 and 26. The carrier-frequency offset of the two carriers 20 and 25 is clearly visible, although the two signals are transmitted on the same channel.

Figure 3:
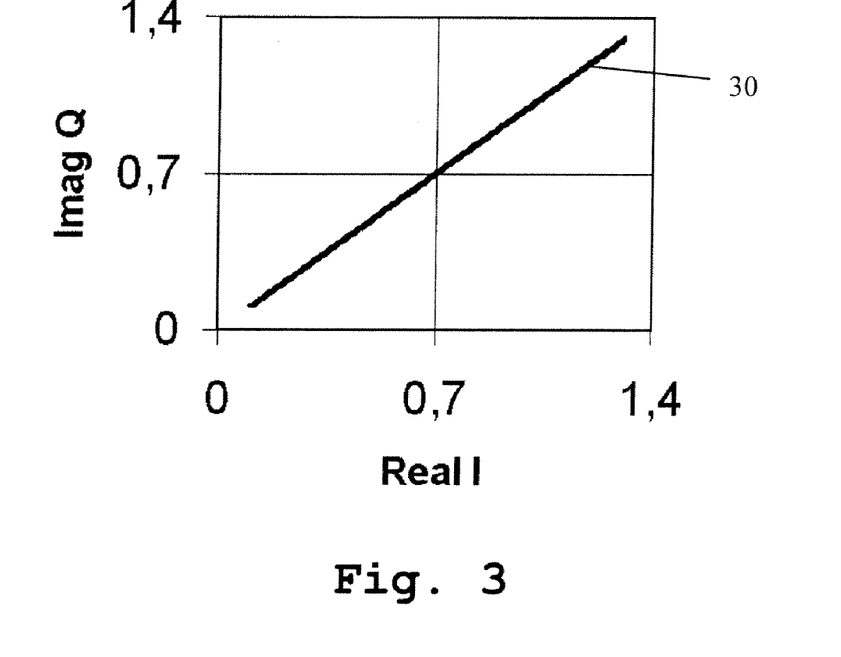
FIG. 3 shows an I/Q diagram of an exemplary ideal amplitude-modulated signal.

FIG. 3 shows an I/Q diagram of an exemplary ideal amplitude-modulated signal. The voice signals have a mean degree of modulation of approximately 30% and peaks of up to 95%, which are caused primarily by sibilants. Recurrent pauses without activity, that is to say, a continuous carrier wave period (CW, continuous wave) with 0% modulation are found in the voice signal. The signal 30 constantly provides the same value of the inphase component and the quadrature component.

Figure 4:
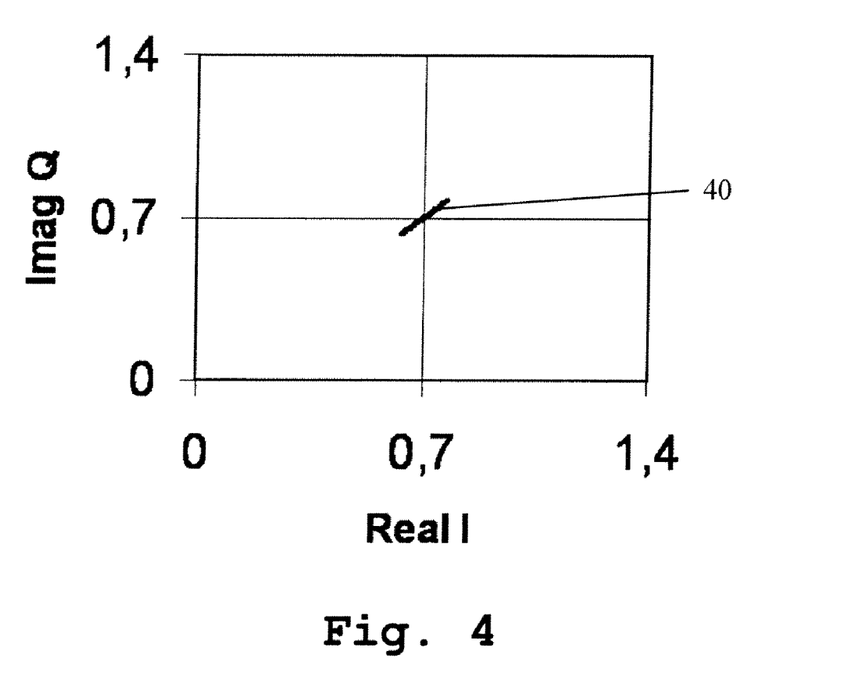
FIG. 4 shows an I/Q diagram of an exemplary amplitude-modulated interference signal.

In FIG. 4, an I/Q diagram of an exemplary amplitude-modulated interference signal is presented. Low-frequency engine noises or humming noises, which are contained periodically in the transmitted signal are particularly critical. These are normally disposed approximately 15 dB to 40 dB below the useful signal and generate a residual modulation of, for example, 10%. The signal 40 is a signal of this kind. Here also, the signal constantly provides the same value of the inphase component and the quadrature component.

Figure 5:
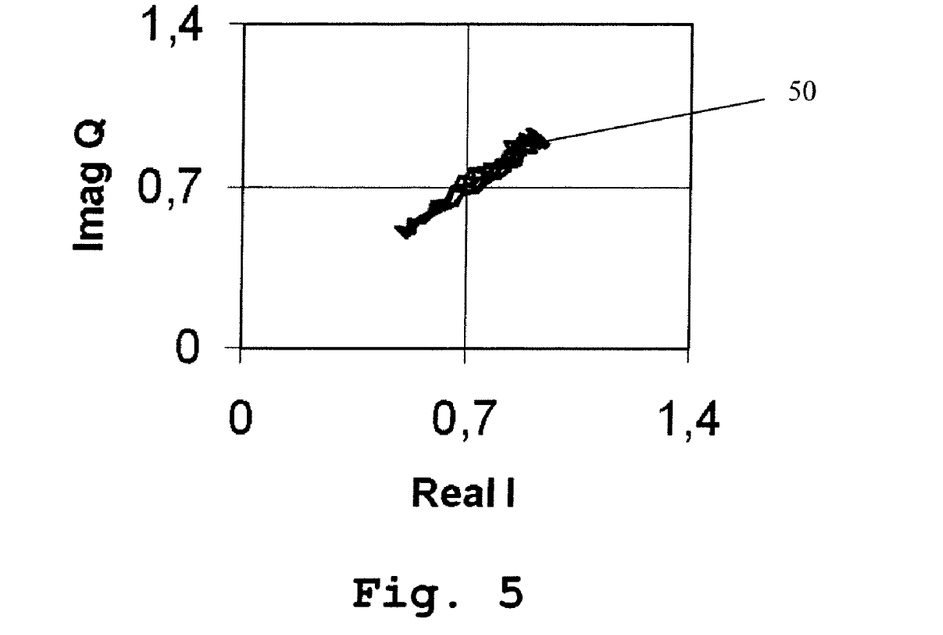
FIG. 5 shows an I/O diagram of an exemplary amplitude-modulated signal with superimposed phase noise caused by a transmission synthesizer.

FIG. 5 shows an I/Q diagram of an exemplary amplitude-modulated signal with superimposed phase noise caused by transmission synthesizer. Conventional PLL synthesizers provide a strong phase noise close to the carrier in the range below 100 Hz. In fact, the AM-DSB modulation method is, in principle, insensitive to this phenomenon, but the detection of the secondary signal is impaired as a result. The illustration shows an AM signal 50 with a 30% degree of modulation taking into consideration phase noise. Accordingly, the inphase component and the quadrature component of the signal 50 are no longer constantly identical. Modern aeronautical radio devices, which are VDL Mode 2 compatible, use rigid-phase DDS or fractional-N synthesizers, so that this problem no longer occurs here. However, it cannot be assumed that all voice radio equipment contains this technology.

Figure 6:
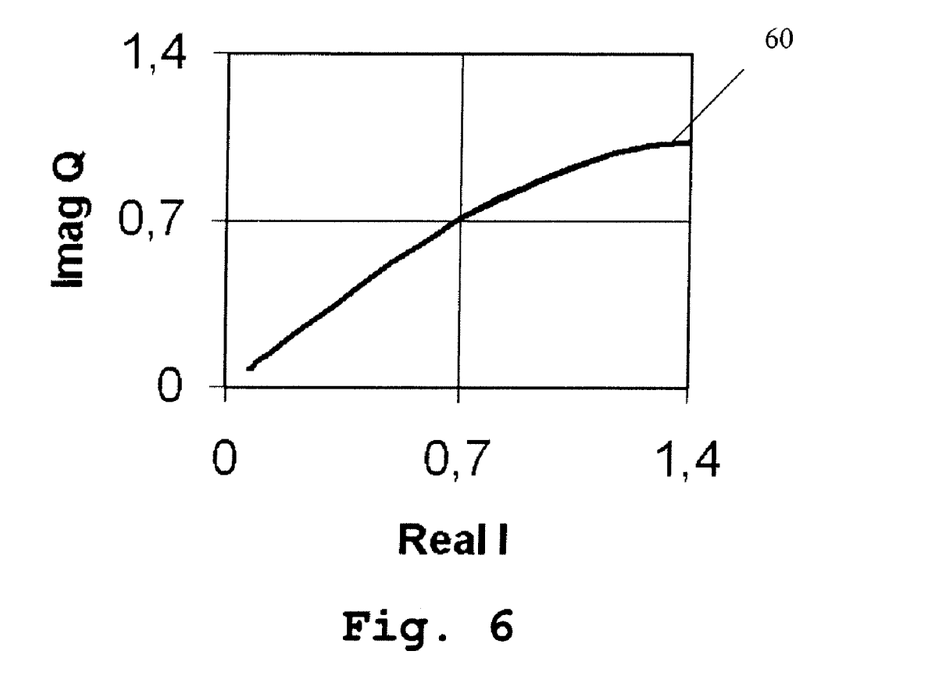
FIG. 6 shows an I/Q diagram of an exemplary amplitude-modulated signal with superimposed phase distortion caused by the transmitter output unit.

In FIG. 6, an I/Q diagram of an exemplary amplitude-modulated signal with superimposed phase distortion caused by a transmission output unit is presented. Dependent upon the quality of the transmitter, phase fluctuations of several degrees, in the extreme case even up to +/−10 degrees occur through the non-linearity of the transmission output unit. The illustration shows how an ideal AM signal 60 is influenced by the effect of the synchronous phase modulation. Accordingly, a significant drop in the imaginary component is evident at higher amplitudes. As described above, modern VDL Mode 2 compatible aeronautical radio equipment is advantageous. These effects are compensated as a result of active linearization, so that a transmitter of this kind provides only slight synchronous PM or none at all.

Figure 7:
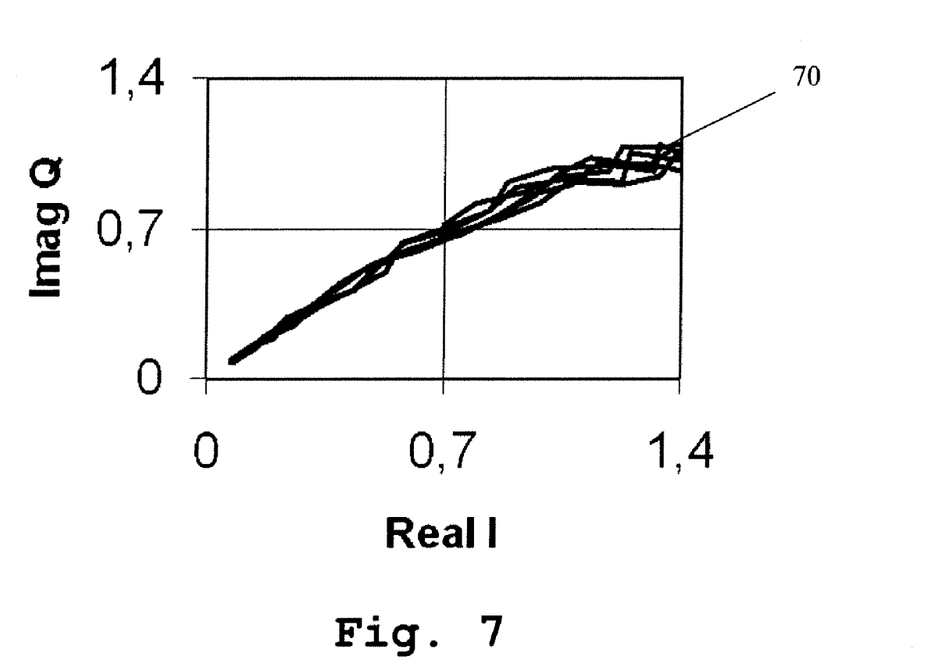
FIG. 7 shows an I/O diagram of an exemplary non-ideal amplitude-modulated signal.

FIG. 7 shows an I/Q diagram of an exemplary non-ideal amplitude-modulated signal. This drawing illustrates the superimposition of the signals 30, 40, 50 and 60 shown with reference to FIGS. 3-6. Both the phase noise and also the synchronous phase modulation, which are superimposed on the ideal signal, are clearly visible. The interference signal 40 is not identifiable because of its similarity with the ideal signal 30.

Figure 8:
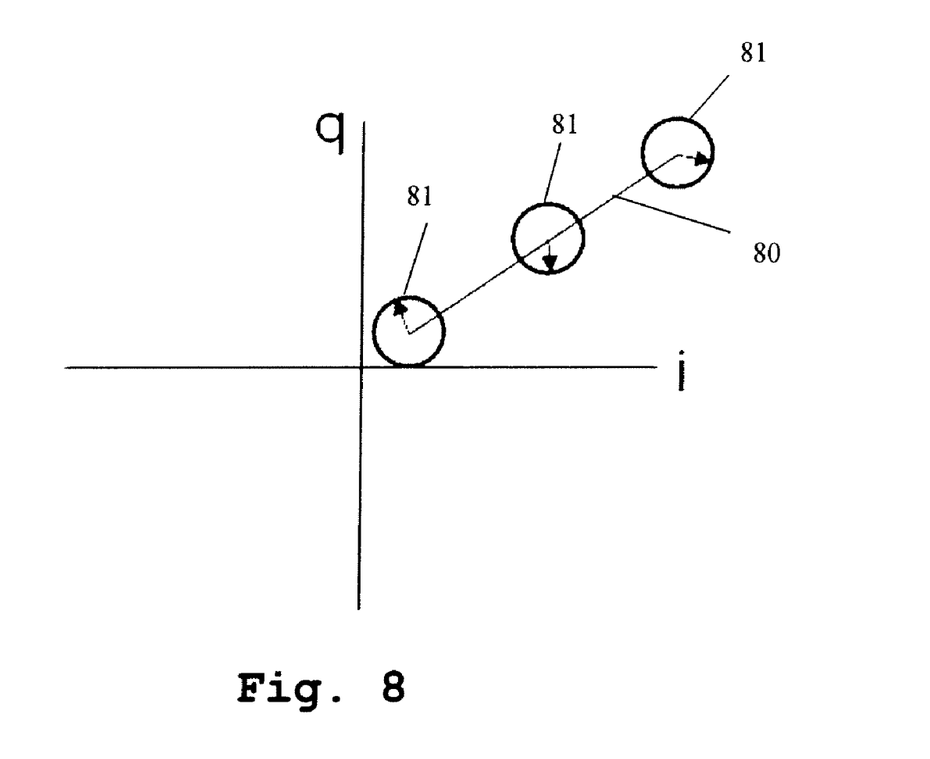
FIG. 8 shows an I/Q diagram of an exemplary amplitude-modulated signal with schematic presentation of a second superimposed amplitude-modulated signal.

In FIG. 8, an I/Q diagram of an exemplary amplitude-modulated signal with schematic presentation of a second, superimposed amplitude-modulated signal is illustrated. The secondary carrier 81 appears as an SSB signal with a differential frequency corresponding to the relative quartz deviation of the two aeronautical radio transmitters, that is to say, the frequency difference between the primary carrier 80 and the secondary carrier 81.

If both transmission signals were to occur un-modulated, which is the case during a pause in speech, this would be the classic case of an SSB (single sideband) modulation. This consideration also applies, if the secondary signal is modulated with voice, because the AM sidebands of the secondary signal are negligible by comparison with the inherent carrier 81. Accordingly, the secondary carrier 81 rotates with the differential frequency around the primary carrier 80. Dependent upon the current value of the primary signal, this therefore provides a sum signal of the primary signal and the secondary carrier.

Figure 9:
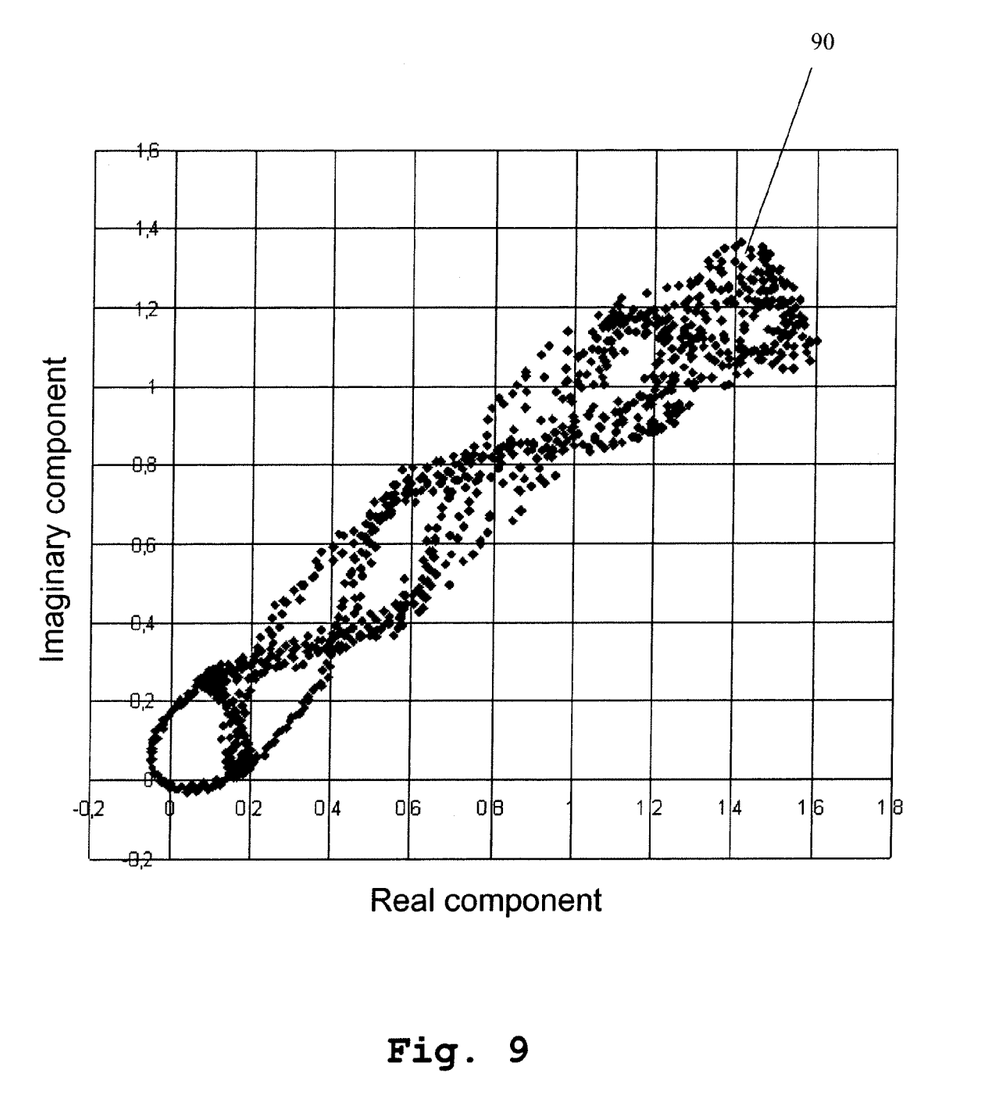
FIG. 9 shows an I/Q diagram of an exemplary amplitude-modulated signal with a superimposed second amplitude-modulated signal.

FIG. 9 shows an I/Q diagram of an exemplary amplitude-modulated signal with a superimposed, second amplitude-modulated signal. From the considerations presented with reference to FIG. 8, the sum signal 90 presented in FIG. 9 is obtained in the I/Q diagram. The rotational movement of the secondary carrier 81 around the primary carrier 80 is clearly visible in this context.

Figure 10:
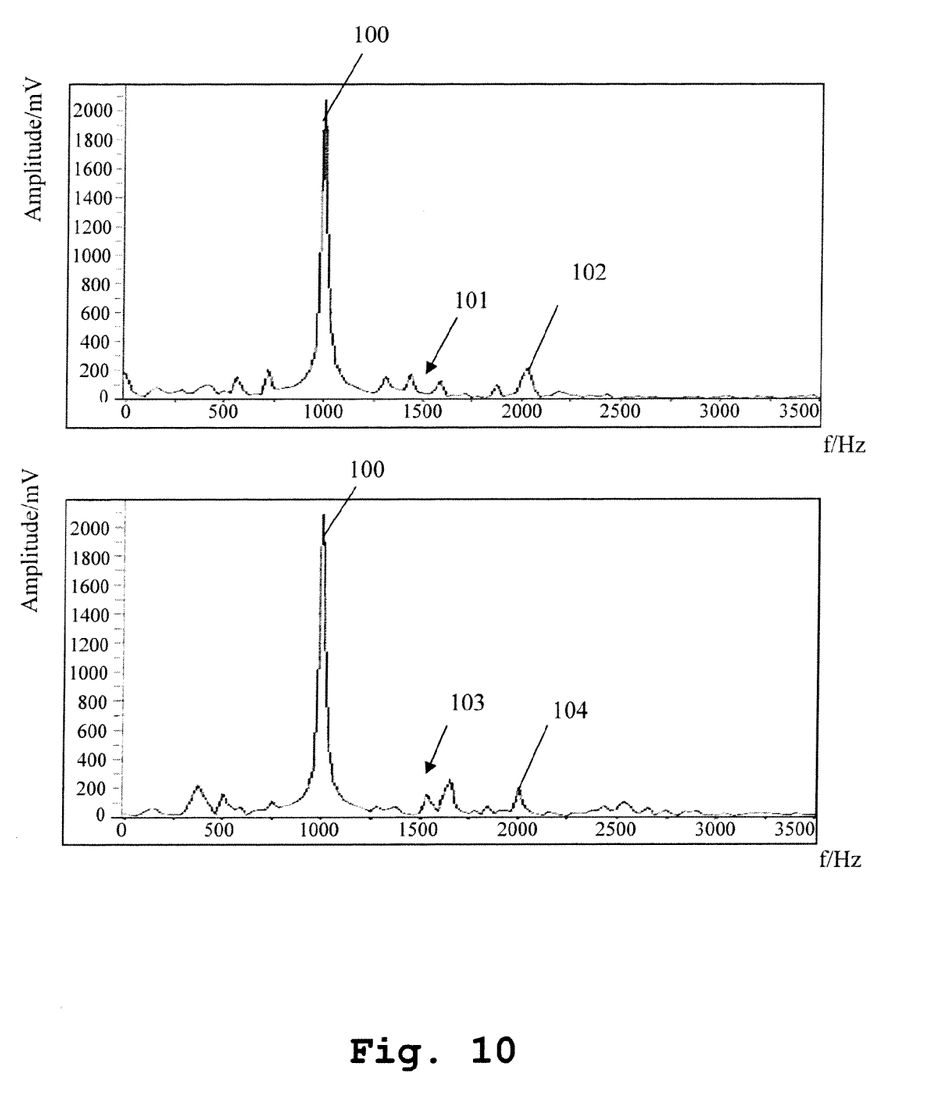
FIG. 10 shows a spectrum of an exemplary amplitude-modulated voice signal with the superimposed, second, non-modulated signal at two different times.

Security and reliability in the detection of double transmission are limited in the case of pure AM demodulation with subsequent spectral analysis. The following example demonstrates the result of two successive Fourier analyses under the following conditions:

primary signal, modulated with voice
secondary signal un-modulated, relationship with primary carrier −20 dBC
frequency difference 1 kHz (not a practical case)

In FIG. 10, a spectrum of an exemplary amplitude-modulated voice signal with a superimposed, second non-modulated signal at two different times is presented. The secondary carrier 102, 104 at the spacing distance of 1 kHz is disposed below the level of the primary carrier 100 by a factor of 10 and is subsumed in the voice signal. In successive evaluations, it is evident that the two carrier signals 102, 104 exist unchanged, while the two mutually-symmetrical sidebands 101, 103 change their energy distribution dependent upon the voice. In practice, frequency deviations between 10 Hz and 240 Hz must be detected, for which reason the FFT window length must be at least 200 ms long. The periodically present SSB carrier can be distinguished from the voice by cascading several FFT windows, which does, however, require a long analysis period. One further disadvantage of this method is the poor robustness by comparison with monotonous background noises, such as engine noise of 200 Hz.

Figure 11:
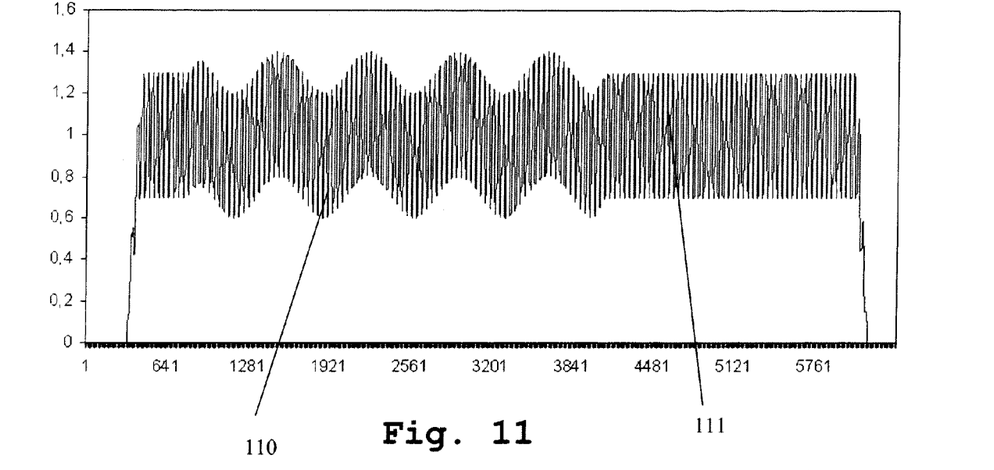
FIG. 11 shows the time characteristic of an exemplary, ideal, amplitude-modulated sinusoidal signal with a partially-superimposed, second, ideal amplitude-modulated sinusoidal signal.

FIG. 11 shows the time characteristic of an exemplary ideal, amplitude-modulated sinusoidal signal 111 with a partially-superimposed, second, ideal amplitude-modulated sinusoidal signal 110. The change in the envelope curve within the range of the second superimposed signal 110 is clearly visible. In a direct Fourier transform, however, the modulation signal is dominant.

Figure 12:
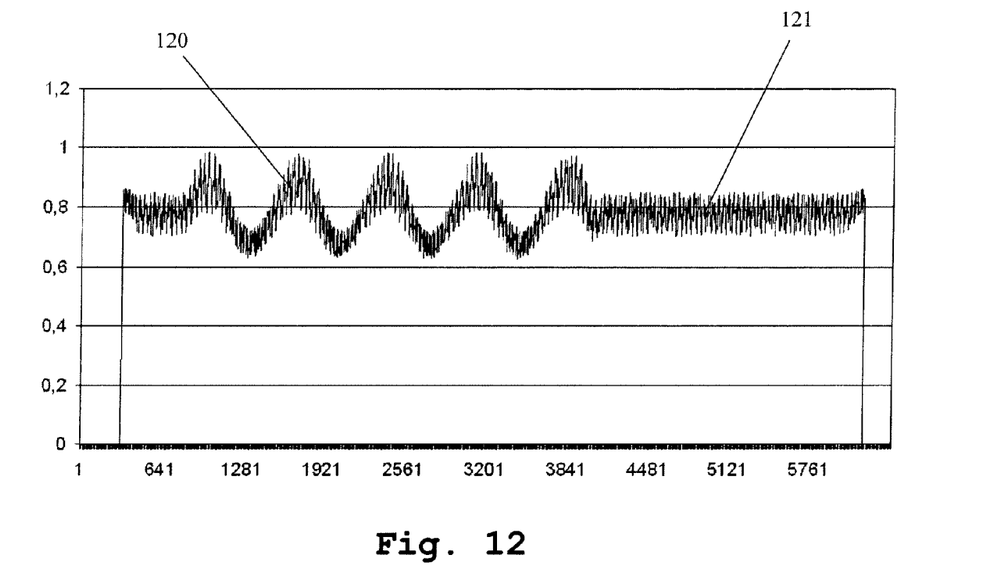
FIG. 12 shows the time characteristic of the phase-demodulated signal from FIG. 11.

However, if the phase-demodulated signal is evaluated instead of the AM demodulated signal, the significance is considerably improved. In FIG. 12, the time characteristic of the phase-demodulated signal from FIG. 11 is illustrated. The example shows that the originally-dominant modulation signal 121 appears at the output of the phase demodulator strongly attenuated even with a conventional transmitter with synchronous phase modulation. By contrast, the sought SSB secondary signal 120 is emphasized by the phase demodulation. If this signal is now Fourier transformed, the differential signal is visible as the main component.

Because of the required fine resolution of 10 Hz or less, the window size for the Fourier transform or the Fast Fourier Transform must be selected to be very long and must be 200 ms or more. With regard to a useful reaction time of the algorithm, only two, a maximum of three windows can be evaluated, which, however, increases the cost of detection security. By means of adaptive windowing or through the use of wavelets, the optimum resolution can always be selected for every differential frequency. In most cases, several evaluation windows can be evaluated in succession and correlated with one another, so that the periodic SSB carrier of the secondary signal can be reliably detected.

Figure 13:
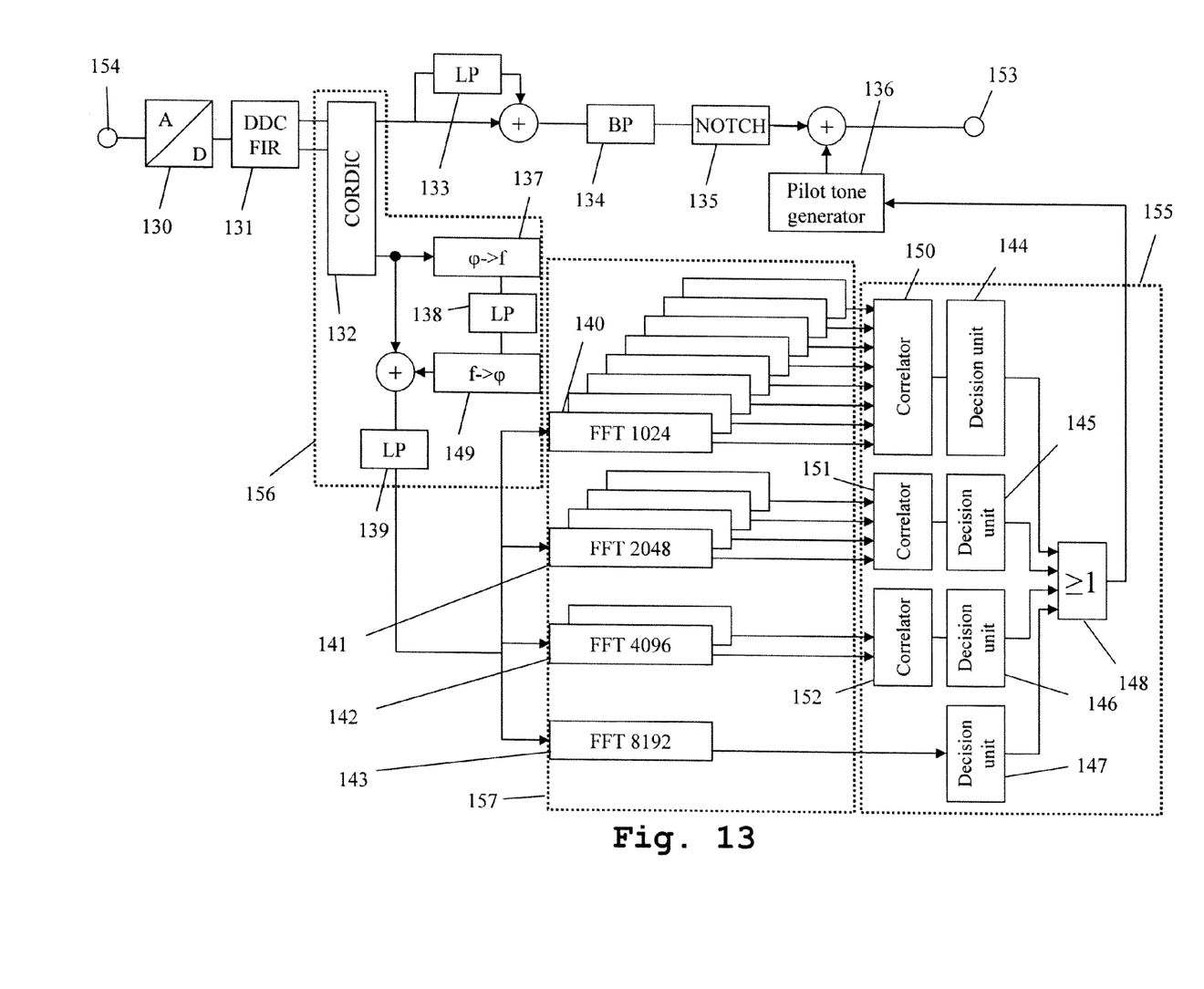
FIG. 13 shows an exemplary embodiment of the device according to the invention.

FIG. 13 shows an exemplary embodiment of the device according to the invention. The intermediate frequency signal, which is disposed at the input 154, is supplied to an analog-digital converter 130 and quantized and sampled by the latter. A downstream DDC FIR (finite impulse response) filter 131 generates an inphase component and quadrature component from the digitized signal. The CORDIC component 132 generates a modulus component and a phase component from this. The modulus component is routed, after an offset correction by means of a low-pass filter 133, via a bandpass filter 134 and a notch filter 135, to the audio output 153. In this context, the bandpass filter 134 and the notch filter 135 remove undesired signal components.

The phase component of the signal is routed via two paths to an adder 160 connected upstream of a low-pass filter 139. The one path is a direct connection. On the second path, the phase signal is initially converted in block 137 into a frequency signal. High-frequency components are removed by means of the low-pass filter 138. Following this, the signal is converted back into a phase signal in block 149 and summated with the un-modified signal. This step is used for frequency tracking. The low-pass filter 139 reduces the phase fluctuations with regard to high-frequency components. In this context, blocks 132, 137, 138, 149 and 139 form the phase demodulator 156.

The signal is now processed through several FFT banks 140, 141, 142 and 143, by implementing a Fast Fourier Transform (FFT, Fast Fourier Transform). With a processing time of, for example, 256 ms, the signal portion in the FFT bank 143 is processed by a single FFT window of, for example, 8192 bits in length. The FFT banks 140, 141 and 142 provide a shorter window length and therefore a shorter processing time. Accordingly, the signal portion of several FFT windows of relatively shorter window length is processed. In this context, blocks 140, 141, 142 and 143 form the Fourier-transformation device 157.

The results of the FFT banks 140, 141 and 142 are correlated by correlators 150, 151 and 152 and accordingly amplified in their information content. The decision units 144, 145, 146 and 147 evaluate whether, through the FFT of the individual window lengths, sufficiently-significant portions of the differential frequencies of the intermediate frequency signals formed in the phase demodulation are contained. If this is the case, the value 1 is routed to the OR disjunction 148. In this context, blocks 150, 151, 152, 144, 145, 146, 147 and 148 form the evaluation device 155. If the OR disjunction 148 provides the value 1, the pilot-tone generator 136 is activated, and a clearly-audible pilot tone is additionally supplied to the audio output 153.

The invention is not restricted to the exemplary embodiment presented. Accordingly, different transformation functions can be used in the frequency domain instead of the Fourier transformation, such as FFT, wavelets, or similar transformations. Instead of an acoustic warning signal, a visual warning signal can also be provided. All of the features described above or illustrated in the drawings can be combined with one another as required within the framework of the invention.

The invention claimed is:

1. Method for detecting the presence of several amplitude-modulated high-frequency signals in a sum signal with closely-adjacent carrier frequencies of the amplitude-modulated high-frequency signals, comprising:
    phase demodulating the sum signal,
    transforming the phase-demodulated sum signal into the frequency domain by implementing several Fourier transforms simultaneously with several transformation-window lengths different with reference to time, and determining the presence of several carrier frequencies of amplitude-modulated high-frequency signals, wherein the presence of several carrier frequencies in the sum signal are detected through OR disfunction of the results of the simultaneous Fourier transforms of different transformation-window lengths.

2. Method according to claim 1, wherein the sum signal is a received signal mixed to an intermediate frequency.

3. Method according to claim 1, comprising detecting the presence of two amplitude-modulated high-frequency signals in the sum signal.

4. Method according to claim 1, comprising, in determining the presence of several carrier frequencies of amplitude-modulated high-frequency signals in the sum signal, determining the carrier-frequency offset of the amplitude-modulated high-frequency signals.

5. Device for detecting the presence of several amplitude-modulated high-frequency signals in the sum signal with closely-adjacent carrier frequencies of the amplitude-modulated high-frequency signals, comprising a phase demodulator, a transformation device and an evaluation device, wherein:

the phase demodulator demodulates the sum signal according to its phase, the transformation device transforms the phase-demodulated sum signal into the frequency by implementing a Fourier transform simultaneously with several transformation-window lengths different with reference to time, and the evaluation device determines the presence of several carrier frequencies of amplitude-modulated high-frequency signals, wherein the presence of several carrier frequencies in the sum signal is detected by the evaluation device through OR disjunction of the results of the simultaneous Fourier transforms of different transformation-window lengths.

6. Device according to claim 5, wherein the sum signal is a received signal mixed to an intermediate frequency.

7. Device according to claim 5, wherein the device detects the presence of two amplitude-modulated high-frequency signals in the sum signal.

8. Device according to claim 5, wherein in determining the presence of several carrier frequencies of amplitude-modulated high-frequency signals in the sum signal, the carrier-frequency offset of the amplitude-modulated high-frequency signals is determined by the evaluation device.

9. Device according to claim 5, wherein the presence of several carrier frequencies in the sum signal is displayed by charging the sum signal with a pilot tone through a pilot-tone generator and/or that an optical alarm signal is generated.

10. Device for detecting the presence of several amplitude-modulated high-frequency signals in the sum signal with closely-adjacent carrier frequencies of the amplitude-modulated high-frequency signals, comprising a phase demodulator, a transformation device and an evaluation device, wherein the phase demodulator demodulates the sum signal according to its phase, the transformation device transforms the phase-demodulated sum signal into the frequency domain, the evaluation device determines the presence of several carrier frequencies of amplitude-modulated high-frequency signals, and the presence of several carrier frequencies in the sum signal is displayed by charging the sum signal with a pilot tone through a pilot-tone generator and/or that an optical alarm signal is generated.

11. Device according to claim 10, wherein the sum signal is a received signal mixed to an intermediate frequency.

12. Device according to claim 10, wherein the device detects the presence of two amplitude-modulated high-frequency signals in the sum signal.

13. Device according to claim 10, wherein in determining the presence of several carrier frequencies of amplitude-modulated high-frequency signals in the sum signal, the carrier-frequency offset of the amplitude-modulated high-frequency signals is determined by the evaluation device.

14. Device according to claim 10, wherein the transformation device implements a Fourier transform and/or a wavelet transformation.

15. Device according to claim 14, wherein the transformation device implements the Fourier transform simultaneously with several transformation-window lengths different with reference to time.

16. Device according to claim 15, wherein the presence of several carrier frequencies in the sum signal is detected by the evaluation device through OR disjunction of the results of the simultaneous Fourier transforms of different transformation-window lengths.

17. Device according to claim 14, wherein the transformation device implements several Fourier transforms of the same transformation-window length of signal portions disposed in time succession, and that the security of the results of the Fourier transform is increased by correlating the results of the several Fourier transforms of identical transformation-window length through a correlator in the evaluation device.

\* \* \* \* \*